(12) United States Patent
Iwata et al.

(10) Patent No.: US 11,482,194 B2
(45) Date of Patent: Oct. 25, 2022

(54) SIMULATION SYSTEM

(71) Applicant: SEKISUI HOUSE, LTD., Osaka (JP)

(72) Inventors: Shouto Iwata, Osaka (JP); Chiho Hiraoka, Osaka (JP); Yuusuke Minami, Osaka (JP); Takeshi Miki, Osaka (JP); Yuuta Kawazoe, Osaka (JP); Takahiro Suezawa, Osaka (JP); Shintarou Kawakami, Osaka (JP); Tetsuya Yamato, Osaka (JP); Masayuki Ogawa, Osaka (JP)

(73) Assignee: SEKISUI HOUSE, LTD., Osaka (JP)

(*) Notice: Subject to any disclaimer, the term of this patent is extended or adjusted under 35 U.S.C. 154(b) by 120 days.

(21) Appl. No.: 16/969,742

(22) PCT Filed: Aug. 28, 2019

(86) PCT No.: PCT/JP2019/033750
§ 371 (c)(1),
(2) Date: Aug. 13, 2020

(87) PCT Pub. No.: WO2020/045513
PCT Pub. Date: Mar. 5, 2020

(65) Prior Publication Data
US 2021/0005166 A1  Jan. 7, 2021

(30) Foreign Application Priority Data

Aug. 31, 2018 (JP) .............................. JP2018-162571

(51) Int. Cl.
*G09G 5/00* (2006.01)
*G09G 5/38* (2006.01)
*G06F 30/13* (2020.01)
*G06F 3/14* (2006.01)

(52) U.S. Cl.
CPC ............. *G09G 5/38* (2013.01); *G06F 3/1423* (2013.01); *G06F 30/13* (2020.01)

(58) Field of Classification Search
None
See application file for complete search history.

(56) References Cited

U.S. PATENT DOCUMENTS

| | | | |
|---|---|---|---|
| 6,701,281 B2 * | 3/2004 | Satoh | G06F 30/13 702/182 |
| 7,246,044 B2 * | 7/2007 | Imamura | G06F 30/13 703/21 |
| 9,972,131 B2 * | 5/2018 | Vaughn | G06T 7/246 |
| 10,408,139 B1 * | 9/2019 | Hamad | C10L 1/08 |
| 11,069,145 B1 * | 7/2021 | Pearson | G06F 3/011 |
| 11,216,498 B2 * | 1/2022 | Raichelgauz | G06F 16/41 |

(Continued)

FOREIGN PATENT DOCUMENTS

| | | |
|---|---|---|
| CA | 2917330 A1 | 7/2016 |
| JP | H10162050 A | 6/1998 |

(Continued)

*Primary Examiner* — Martin Mushambo
(74) *Attorney, Agent, or Firm* — Cantor Colburn LLP

(57) ABSTRACT

A simulation system includes a controller. The controller refers to a detection result of a detector, the detector configured to detect a portable unit prepared to create a simulation of a building, and controls a display device to show an image related to the building.

7 Claims, 9 Drawing Sheets

(56) References Cited

U.S. PATENT DOCUMENTS

| | | | | |
|---|---|---|---|---|
| 2001/0027388 A1* | 10/2001 | Beverina | G06Q 50/26 | 703/22 |
| 2003/0080976 A1* | 5/2003 | Satoh | G06T 7/80 | 345/629 |
| 2005/0017921 A1* | 1/2005 | Okude | G06F 3/1431 | 345/1.1 |
| 2005/0289590 A1* | 12/2005 | Cheok | G06F 3/0346 | 725/62 |
| 2006/0274060 A1* | 12/2006 | Ni | G06F 3/0482 | 345/419 |
| 2007/0219645 A1* | 9/2007 | Thomas | G05B 15/02 | 700/29 |
| 2010/0315418 A1* | 12/2010 | Woo | G06F 3/04815 | 345/419 |
| 2012/0092328 A1* | 4/2012 | Flaks | G06V 20/10 | 345/419 |
| 2012/0223943 A1* | 9/2012 | Williams | G06Q 30/06 | 345/173 |
| 2014/0043321 A1* | 2/2014 | Matjasko | G06T 19/006 | 345/419 |
| 2014/0285400 A1* | 9/2014 | Sato | G06F 3/1446 | 345/1.3 |
| 2014/0375674 A1* | 12/2014 | Rice | G06T 11/001 | 345/593 |
| 2016/0026359 A1* | 1/2016 | Glik | G06T 19/20 | 345/419 |
| 2016/0335914 A1* | 11/2016 | Anderson | A63B 69/36 | |
| 2018/0188831 A1* | 7/2018 | Lyons | G06F 3/0317 | |
| 2018/0245366 A1* | 8/2018 | Choi | E04B 1/04 | |
| 2019/0371071 A1* | 12/2019 | Lyons | G06F 3/0304 | |
| 2019/0371079 A1* | 12/2019 | Du | G06T 19/20 | |
| 2020/0057827 A1* | 2/2020 | Eckenrode | G06Q 50/16 | |
| 2020/0065444 A1* | 2/2020 | Bullock | G06F 30/367 | |
| 2021/0040723 A1* | 2/2021 | Lin | E04B 1/34869 | |
| 2021/0117582 A1* | 4/2021 | Kamenca | G06F 30/13 | |

FOREIGN PATENT DOCUMENTS

| | | |
|---|---|---|
| JP | 2000089886 A | 3/2000 |
| JP | 2001297122 A | 10/2001 |
| JP | 2004086274 A | 3/2004 |
| JP | 2005275895 A | 10/2005 |
| JP | H09006585 A | 10/2005 |
| JP | 2008123376 A | 5/2008 |
| JP | 2010067025 A | 3/2010 |
| JP | 2010217350 A | 9/2010 |
| JP | 2012123530 A | 6/2012 |
| JP | 2016137117 A | 8/2016 |
| WO | 2012118925 A1 | 7/2012 |
| WO | 2020045513 A1 | 5/2020 |

\* cited by examiner

| 1st Type Portable Unit (20A) | | |
|---|---|---|
| 1st Image Display Section | 2nd Image Display Section | 3rd Image Display Section |
|  |  |  |
| 1st Identification Section | 2nd Identification Section | 3rd Identification Section |
|  |  |  |

Fig.4

| 1st Type Portable Unit (20B) | | |
|---|---|---|
| 1st Image Display Section | 2nd Image Display Section | 3rd Image Display Section |
| | | |
| 1st Identification Section | 2nd Identification Section | 3rd Identification Section |
| | | |

Fig.5

| 1st Type Portable Unit (20C) | | |
|---|---|---|
| 1st Image Display Section | 2nd Image Display Section | 3rd Image Display Section |
| | | |
| 1st Identification Section | 2nd Identification Section | 3rd Identification Section |
| | | |

| 2nd Type Portable Unit (30A) | |
|---|---|
| 1st Image Display Section | 2nd Image Display Section |
|  |  |
| 1st Identification Section | 2nd Identification Section |
|  |  |

SIMULATION SYSTEM

Priority under 35 U.S.C. § 119(a) and 35 U.S.C. § 365(b) is claimed from Japanese Patent Application No. 2018-162571, filed on Aug. 31, 2018, the disclosure of which is also incorporated herein by reference.

TECHNICAL FIELD

The present invention relates to a simulation system.

BACKGROUND ART

A known simulation system creates a simulation for a model of a building. As one example of such a simulation system, Patent Document 1 describes a building design system (1) that shows a model of a building combining building elements, which are selected by a user with an input device (4) from multiple building elements displayed on a display device (3).

PRIOR ART DOCUMENT

Patent Document

Patent Document 1: Japanese Laid-Open Patent Publication No. 2001-297122

SUMMARY OF THE INVENTION

Problems that the Invention is to Solve

In the building design system (1), if the user is not accustomed to operating the input device (4), it will be difficult to create a simulation of a building.

Means for Solving the Problems (1) A simulation system related to the present invention includes a controller that refers to a detection result of a detector, which detects a portable unit prepared to create a simulation of a building, and controls a display device to show an image related to the building.

In the simulation system, an image related to a building is shown in accordance with the detection result of the detector. Thus, a simulation of a building is easily created.

(2) In the simulation system described in (1), it is preferred that the controller control the display device to show at least one of an image of the building or an image of an outdoor facility.

This allows for the creation of a variety of simulations.

(3) In the simulation system described in (1) or (2), it is preferred that the controller further control the display device to show additional information associated with the building in addition to the image related to the building.

This allows for the creation of a variety of simulations.

(4) In the simulation system described in any one of (1) to (3), it is preferred that the simulation system further include a displayed portion in which the image is shown.

This improves convenience.

(5) In the simulation system described in any one of (1) to (4), it is preferred that the simulation system further include a layout portion configured to hold the portable unit.

This stably holds the portable unit.

(6) In the simulation system described in (5) referring to (4), it is preferred that the simulation system further include a table, and the displayed portion and the layout portion are arranged on the table.

This simplifies the configuration of the simulation system.

(7) In the simulation system described in any one of (1) to (6), it is preferred that the simulation system further include the portable unit.

This improves convenience.

(8) In the simulation system described in (7), it is preferred that the portable unit include an image display section that displays an image related to an element of a building.

In this manner, building elements can be easily recognized.

(9) In the simulation system described in (8), it is preferred that the portable unit further include an identification section that indicates identification information corresponding to the image.

Thus, images can be easily identified.

(10) In the simulation system described in (9), it is preferred that the portable unit be polyhedron, and the image display section and the identification section be arranged on different surfaces of the polyhedron.

This allows for easy association of the image display section and the identification section.

Effects of the Invention

The simulation system related to the present invention easily creates a simulation of a building.

BRIEF DESCRIPTION OF THE DRAWINGS

FIG. 4 is a diagram of image display sections and identification sections, which are arranged on another first type portable unit differing from the one shown in FIG. 3.

FIG. 5 is a diagram of image display sections and identification sections, which are arranged on a further first type portable unit differing from the ones shown in FIGS. 3 and 4.

MODES FOR CARRYING OUT THE INVENTION

Embodiment

Figure 1:
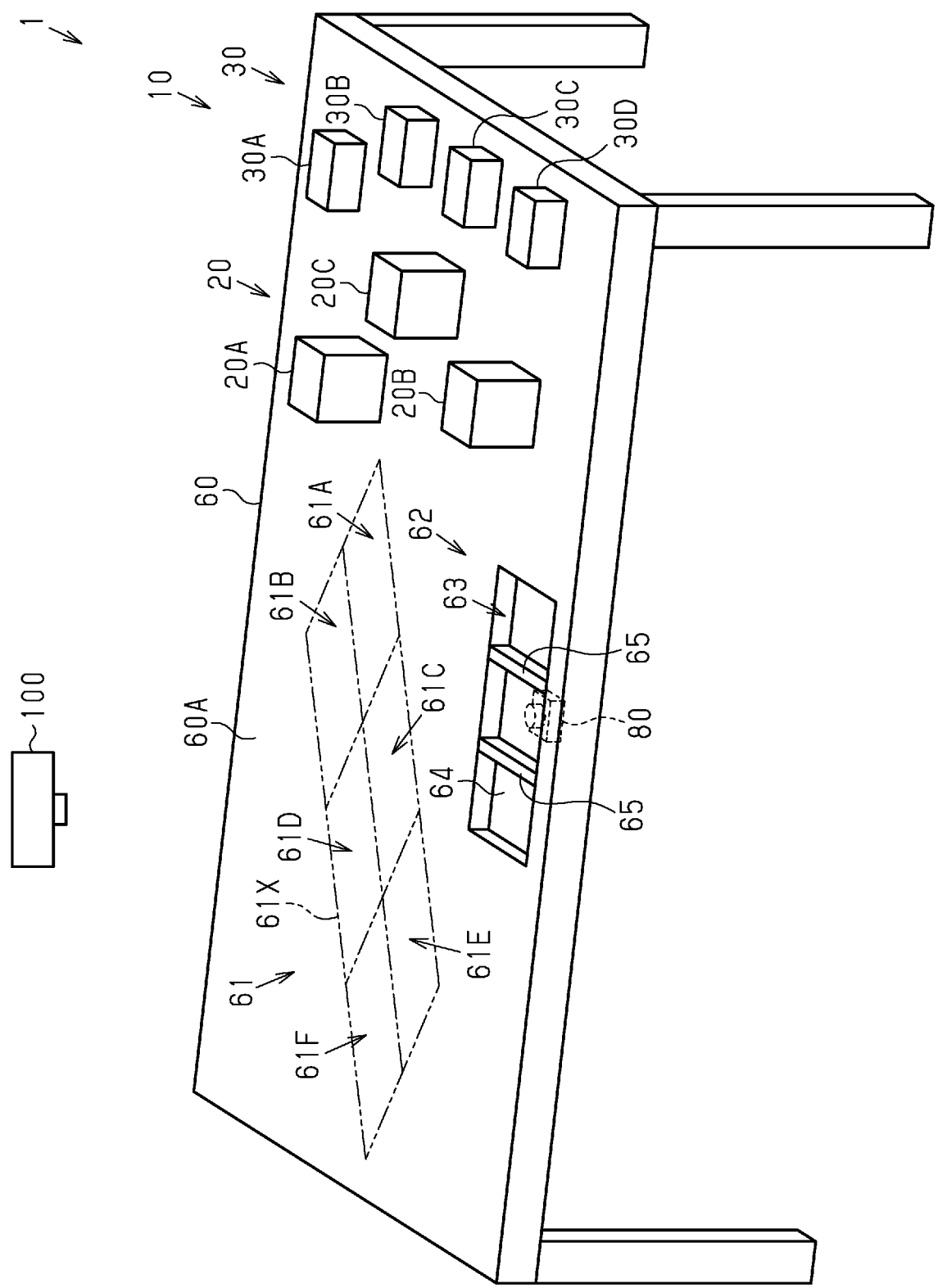
FIG. 1 is a diagram of a simulation system of one embodiment.

One example of a simulation system 1 will now be described with reference to FIG. 1. The simulation system 1 is a system configured to easily create a simulation of a building by displaying an image related to the building (hereafter referred to as "building-related image"). A building-related image includes an image of a building and an image of an element related to a building. A building includes, for example, interior decorations, the interior, the exterior, and the floor plan of a residence, as well as interior decorations, the interior, and the exterior of a garage. The floor plan of a building includes, for example, the layout of at least one of a living room, a dining room, a living-dining room, a kitchen, a bedroom, a reception room, a study, an entrance, an entrance hall, a hallway, a staircase, a toilet, a washroom, a powder room, a bathroom, a storage room, and a closet. An element related to a building includes, for example, an outdoor facility, a porch, and an automobile. This allows for the creation of a variety of simulations. The simulation system 1 may be arranged at any location. In a first example, at least some elements of the simulation system 1 are arranged inside or outside a portable showroom. In a second example, at least some elements of the simulation system 1 are arranged inside or outside a permanent showroom.

The main elements of the simulation system 1 include portable units 10, a table 60, a camera 80, a terminal device 90 (refer to FIG. 12), and a display device 100. The portable units 10 are prepared for creating a simulation of a building. Each portable unit 10 may be configured in any manner. In a first example, the portable unit 10 is a polyhedron. In a further preferred example, as shown in FIG. 1 etc., the portable unit 10 is a hexahedron. In a second example, each portable unit 10 is a compact panel. Each portable unit 10 may be formed from any material. In a preferred example, each portable unit 10 is formed from a lightweight material that allows easy operation by a user. Examples of a lightweight material include wood, a styrene board, paper, and synthetic resin.

The portable units 10 are classified into a first type portable unit 20 and a second type portable unit 30. The first type portable unit 20 is mainly used to create a simulation of a residence or a garage. There are one or more first type portable units 20. In one example, the number of the first type portable units 20 is three. Hereinafter, the three first type portable units 20 may respectively be referred to as the first type portable unit 20A, the first type portable unit 20B, and the first type portable unit 20C to distinguish the first type portable units 20 from one another.

The second type portable unit 30 is mainly used to create a simulation of an outdoor facility or a porch. There are one or more second type portable units 30. In one example, the number of the second type portable units 30 is four. Hereinafter, the four second type portable units 30 may respectively be referred to as the second type portable unit 30A, the second type portable unit 30B, the second type portable unit 30C, and the fourth type portable unit 30D to distinguish the second type portable units 30 from one another.

Figures 6, 7:
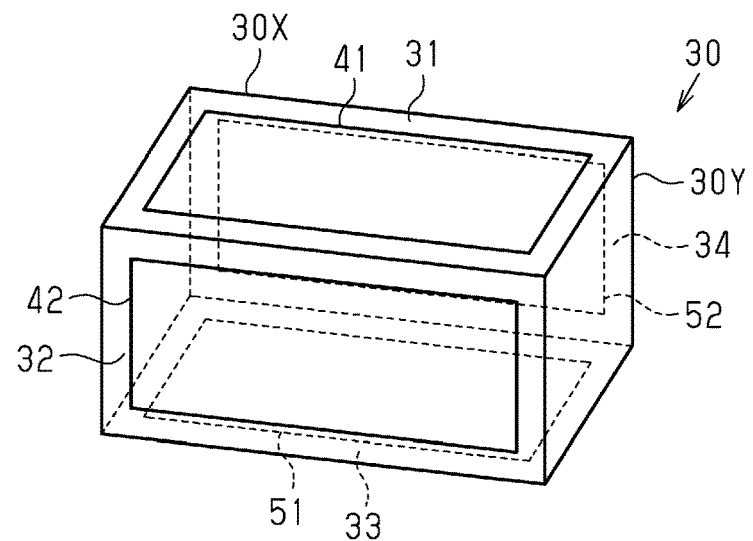
FIG. 6 is a perspective view of a second type portable unit shown in FIG. 1.
FIG. 7 is a diagram of image display sections and identification sections arranged on the second type portable unit shown in FIG. 1.

The portable units 10 each include an image display section 40 and an identification section 50. In FIGS. 1, 2, and 6, the image display section 40 and the identification section 50 are partially or entirely omitted for simplicity and clarity. The image display section 40 and the identification section 50 are arranged on different surfaces of the polyhedron. This allows for easy association of the image display section 40 with the identification section 50. The image display section 40 displays an image (hereafter, referred to as "model image") related to an element of a building. An element of a building is a model of a building-related image. The identification section 50 indicates identification information corresponding to the model image. The identification section 50 may be configured in any manner. In one example, the identification section 50 includes a one-dimensional code or a two-dimensional code.

As shown in FIG. 2, the first type portable unit 20 is, for example, box-shaped. The image display section 40 arranged on the first type portable unit 20 includes a first image display section 41, a second image display section 42, and a third image display section 43. The first image display section 41 is arranged on a first surface 21 of the first type portable unit 20. The second image display section 42 is arranged on a second surface 22 of the first type portable unit 20. The third image display section 43 is arranged on a third surface 23 of the first type portable unit 20.

The identification section 50 arranged on the first type portable unit 20 includes a first identification section 51, a second identification section 52, and a third identification section 53. The first identification section 51 indicates identification information corresponding to the model image displayed on the first image display section 41. The first identification section 51 is arranged on a fourth surface 24 of the first type portable unit 20. The fourth surface 24 is located at the side opposite to the first surface 21.

The second identification section 52 indicates identification information corresponding to the model image displayed on the second image display section 42. The second identification section 52 is arranged on a fifth surface 25 of the first type portable unit 20. The fifth surface 25 is located at the side opposite to the second surface 22.

The third identification section 53 indicates identification information corresponding to the model image displayed on the third image display section 43. The third identification section 53 is arranged on a sixth surface 26 of the first type portable unit 20. The sixth surface 26 is located at the side opposite to the third surface 23.

FIG. 3 shows examples of the image display section 40 and the identification section 50 arranged on the first type portable unit 20A. The image display section 40 on the first type portable unit 20A displays image models of a garage. The first image display section 41 of the first type portable unit 20A displays a two-story garage with a flat roof. The second image display section 42 of the first type portable unit 20A displays a two-story garage with a pent roof. The third image display section 43 of the first type portable unit 20A displays a two-story garage with a gable roof.

FIG. 4 shows examples of the image display section 40 and the identification section 50 arranged on the first type portable unit 20B. The image display section 40 on the first type portable unit 20B displays image models of a residence. The first image display section 41 of the first type portable unit 20B displays a two-story residence with a flat roof. The second image display section 42 of the first type portable unit 20B displays a two-story residence with a pent roof. The third image display section 43 of the first type portable unit 20B displays a two-story residence with a gable roof.

FIG. 5 shows examples of the image display section 40 and the identification section 50 arranged on the first type portable unit 20C. The image display section 40 on the first type portable unit 20C displays image models of an annex to a residence. The first image display section 41 of the first type portable unit 20C displays a two-story annex model of a residence with a flat roof. The second image display section 42 of the first type portable unit 20C displays a two-story annex model of a residence with a pent roof. The third image display section 43 of the first type portable unit 20C displays a two-story annex model of a residence with a gable roof.

As shown in FIG. 6, the second type portable unit 30 is, for example, box-shaped. The second type portable unit 30 has a long side 30X having substantially the same length as a long side 20X of the first type portable unit 20 (refer to FIG. 2). The second type portable unit 30 has a height 30Y that is lower than a height 20Y of the first type portable unit 20 (refer to FIG. 2). The image display section 40 arranged on the second type portable unit 30 includes the first image display section 41 and the second image display section 42. The first image display section 41 is arranged on a first surface 31 of the second type portable unit 30. The second image display section 42 is arranged on a second surface 32 of the second type portable unit 30.

The identification section 50 arranged on the second type portable unit 30 includes the first identification section 51 and the second identification section 52. The first identification section 51 indicates the identification information corresponding to the model image displayed on the first image display section 41. The first identification section 51 is arranged on a third surface 33 of the second type portable unit 30. The third surface 33 is located at the side opposite to the first surface 31.

The second identification section 52 indicates the identification information corresponding to the model image displayed on the second image display section 42. The second identification section 52 is arranged on a fourth surface 34 of the second type portable unit 30. The fourth surface 34 is located at the side opposite to the second surface 32.

FIG. 7 shows examples of the image display section 40 and the identification section 50 arranged on the second type portable unit 30A. The image display section 40 arranged on the second type portable unit 30A displays image models of an outdoor facility. The first image display section 41 of the second type portable unit 30A displays a lawn. The second image display section 42 of the second type portable unit 30A displays a garden.

Figure 8:
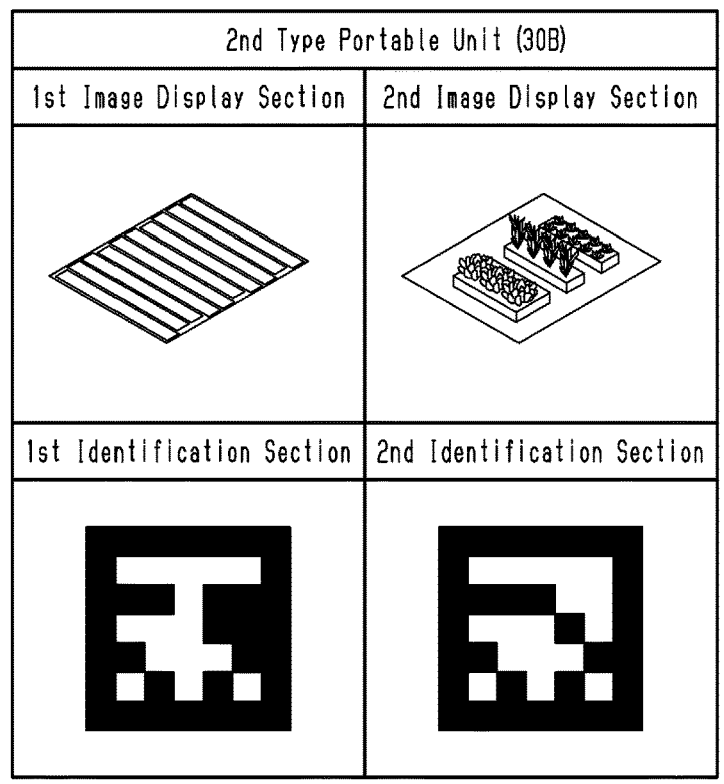
FIG. 8 is a diagram of image display sections and identification sections, which are arranged on another second type portable unit differing from the one shown in FIG. 7.

FIG. 8 shows examples of the image display section 40 and the identification section 50 arranged on the second type portable unit 30B. The image display section 40 arranged on the second type portable unit 30B displays image models of an outdoor facility. The first image display section 41 of the second type portable unit 30B displays pavers. The second image display section 42 of the second type portable unit 30B displays raised garden beds.

Figure 9:
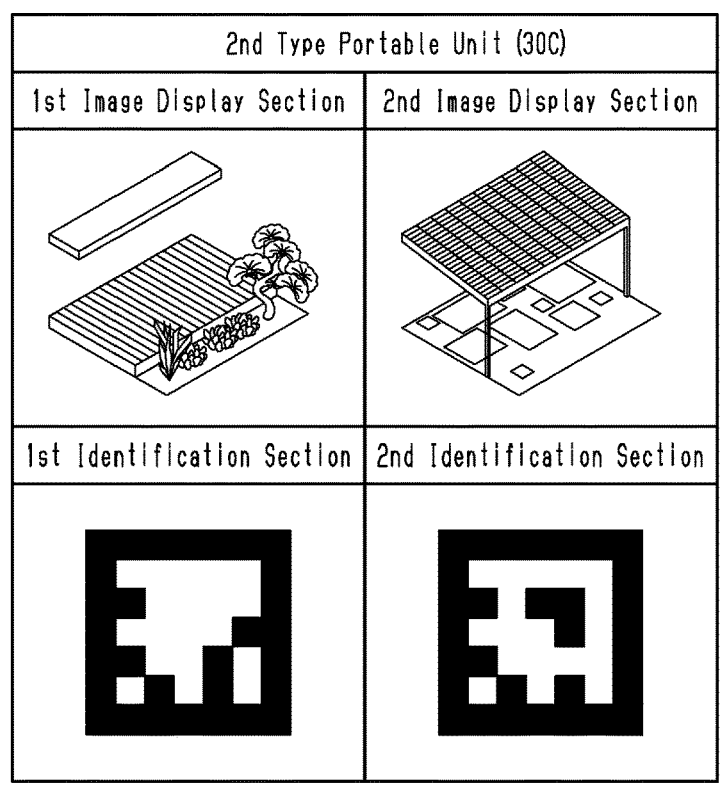
FIG. 9 is a diagram of image display sections and identification sections, which are arranged on a further second type portable unit differing from the ones shown in FIGS. 7 and 8.

FIG. 9 shows examples of the image display section 40 and the identification section 50 arranged on the second type portable unit 30C. The image display section 40 arranged on the second type portable unit 30C displays image models of an outdoor facility. The first image display section 41 of the second type portable unit 30C of displays a decked porch. The second image display section 42 of the second type portable unit 30C displays a roofed porch.

Figure 10:
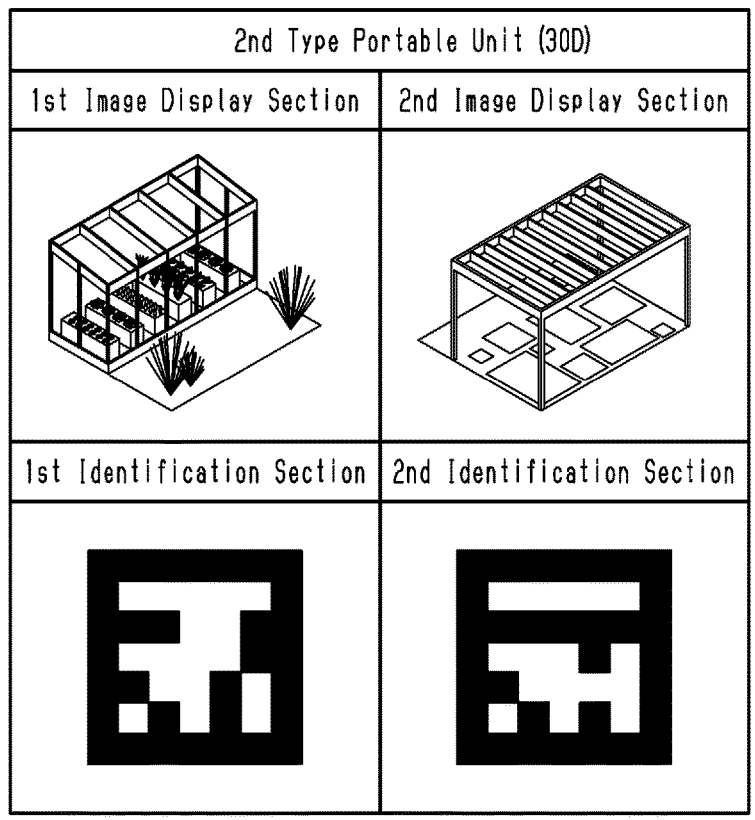
FIG. 10 is a diagram of image display sections and identification sections, which are arranged on a further second type portable unit differing from the ones shown in FIGS. 7 to 9.

FIG. 10 shows examples of the image display section 40 and the identification section 50 arranged on the second type portable unit 30D. The image display section 40 arranged on the second type portable unit 30D displays image models of an outdoor facility. The first image display section 41 of the second type portable unit 30C displays a greenhouse porch. The second image display section 42 of the second type portable unit 30C displays a pergola.

Figures 2, 3:
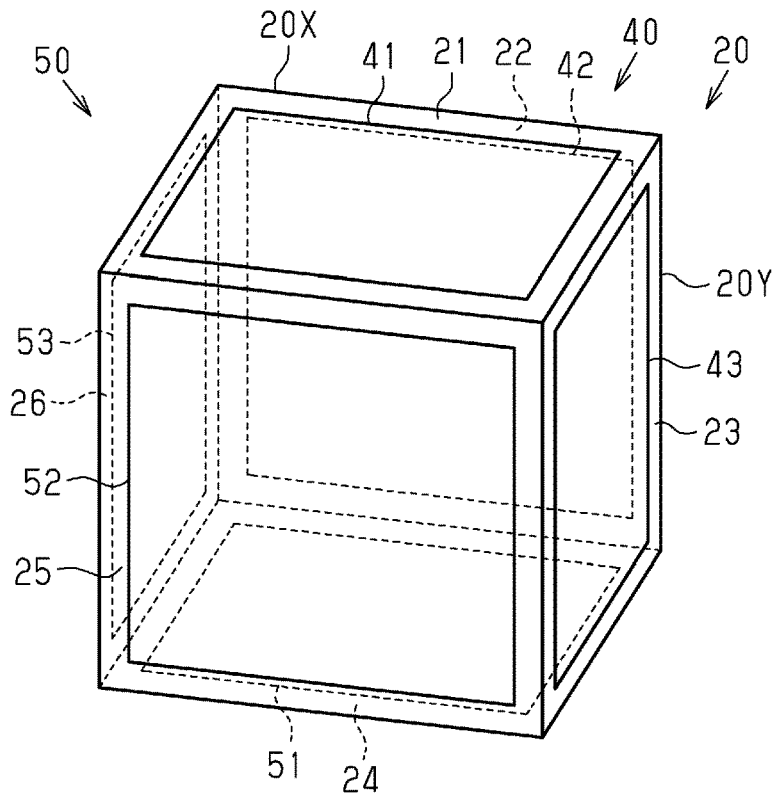
FIG. 2 is a perspective view of a first type portable unit shown in FIG. 1.
FIG. 3 is a diagram of image display sections and identification sections arranged on the first type portable unit shown in FIG. 1.

The table 60 shown in FIG. 1 includes a displayed portion 61 and a layout portion 62. The displayed portion 61 is a portion of an upper surface 60A of the table 60 where the building-related images are displayed by the display device 100. The building-related images are displayed in a region 61X of the displayed portion 61, and the region 61X is divided into a first region 61A, a second region 61B, a third region 61C, a fourth region 61D, a fifth region 61E, and a sixth region 61F. The region 61X is indicated by double-dotted lines in FIG. 1 etc.

Figure 11:
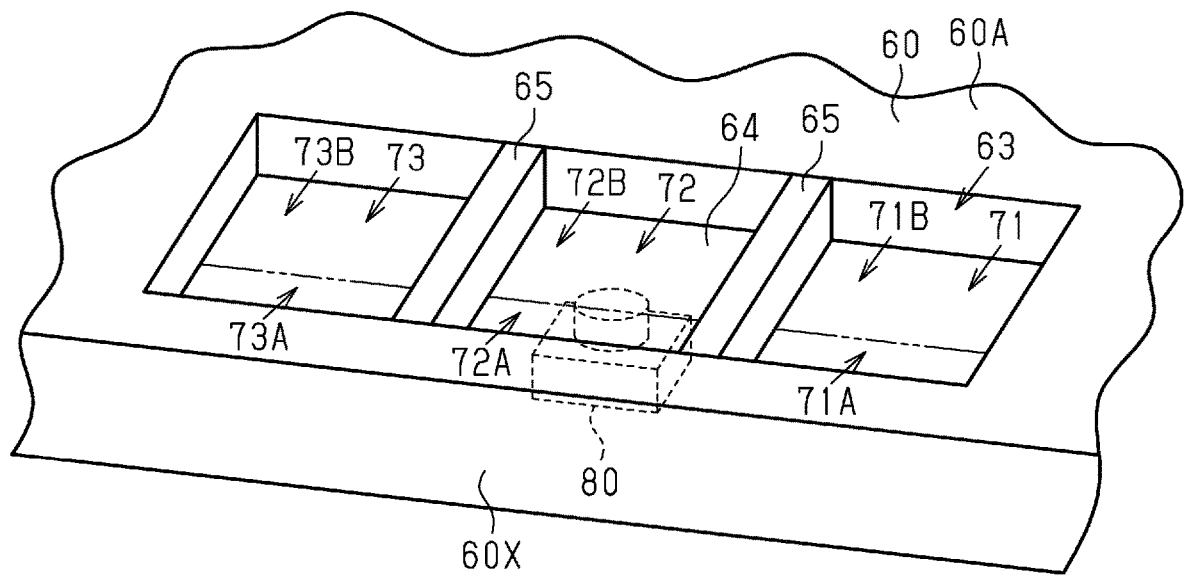
FIG. 11 is a perspective view of a layout portion and its periphery.

The layout portion 62 is configured to hold the portable units 10. Thus, the portable units 10 are stably held in position. The layout portion 62 may be configured in any manner. In the example shown in FIG. 11, the layout portion 62 includes a recess 63, a transparent panel 64, and partitions 65. The recess 63 is arranged in the table 60, the transparent panel 64 is located at the bottom of the recess 63, and the partitions 65 partition the recess 63.

One example of the transparent panel 64 is a glass panel or an acrylic panel. One or more partitions 65 are arranged in the recess 63. In one example, the number of the partitions 65 in the recess 63 is two. The recess 63 is partitioned by the two partitions 65 into a first region 71, a second region 72, and a third region 73.

The regions 71, 72, and 73 are each large enough to hold one first type portable unit 20 and one second type portable unit 30. Further, the regions 71, 72, and 73 are divided into front areas 71A, 72A, and 73A that are closer to one edge 60X of the table 60 and rear areas 71B, 72B, and 73C that are farther from the edge 60X of the table 60. When the portable units 10 are placed in the regions 71, 72, and 73, building-related images corresponding to the model images displayed on the image display sections 40 of the portable unit 10 are displayed in the region 61X of the displayed portion 61 (refer to FIG. 1).

When a portable unit 10 is placed in the front area 71A of the first region 71, a building-related image is displayed in the first region 61A (refer to FIG. 1). When a portable unit 10 is placed in the rear area 71B of the first region 71, a building-related image is displayed in the second region 61B (refer to FIG. 1). When a portable unit 10 is placed in the front area 72A of the second region 72, a building-related image is displayed in the third region 61C (refer to FIG. 1). When a portable unit 10 is placed in the rear area 72B of the second region 72, a building-related image is displayed in the fourth region 61D (refer to FIG. 1). When a portable unit 10 is placed in the front area 73A of the third region 73, a building-related image is displayed in the fifth region 61E (refer to FIG. 1). When a portable unit 10 is placed in the rear area 73B of the third region 73, a building-related image is displayed in the sixth region 61F (refer to FIG. 1).

The camera 80 is arranged facing the transparent panel 64 to entirely capture the regions 71, 72, and 73. The camera 80 is connected to the terminal device 90 so that a still image or a moving image (hereafter, referred to "layout portion information") capturing the regions 71, 72, and 73 from the bottom is transmitted to the terminal device 90 (refer to FIG. 12). The camera 80 establishes communication with the terminal device 90 through wireless communication or wired communication.

Figure 12:
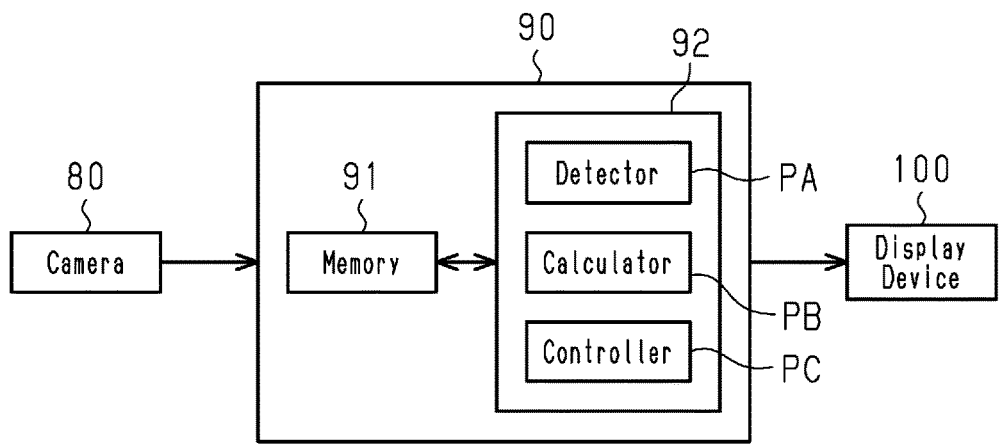
FIG. 12 is a block diagram of the simulation system shown in FIG. 1.

Examples of the terminal device 90 of FIG. 12 include a personal computer, a server, and a smart device. A smart device is, for example, a tablet or a smartphone. When the terminal device 90 is a server, the terminal device 90 is arranged inside or outside the showroom. In the example shown in FIG. 12, the terminal device 90 is a personal computer. The terminal device 90 includes a memory 91 and a processor 92. The memory 91 is, for example, an auxiliary memory device such as a hard disk drive. The memory 91 stores one or more types of application software (hereafter, referred to as "image display software") for showing the building-related images on the displayed portion 61.

The processor 92 is connected to the memory 91 in a manner allowing for communication with the memory 91. The processor 92 executes the image display software stored in the memory 91 to form one or more function blocks of the processor 92. The one or more function blocks include a detector PA, a calculator PB, and a controller PC. The memory 91 stores information obtained by execution of the image display software by the processor 92.

The detector PA detects the identification section 50 of each portable unit 10 placed in the layout portion 62 and the area where the identification section 50 is located in the region 61X based on the layout portion information transmitted from the camera 80. The calculator PB refers to a detection result of the detector PA to calculate additional information associated with the building. This allows for the creation of a variety of simulations. The additional information includes model cost information and model environment load information. The model cost information is, for example, the cost required for constructing the building corresponding to the building-related image displayed on the displayed portion 61 (refer to FIG. 1). The model environment load information is, for example, the amount of greenhouse gas emission from the building corresponding to the building-related image displayed on the displayed portion 61. The controller PC refers to the detection result of the detector PA to control the display device 100 to show a building-related image on the displayed portion 61. The controller PC refers to a calculation result of the calculator PB to control the display device 100 and show the model cost information and the model environment load information on the displayed portion 61.

Figure 13:
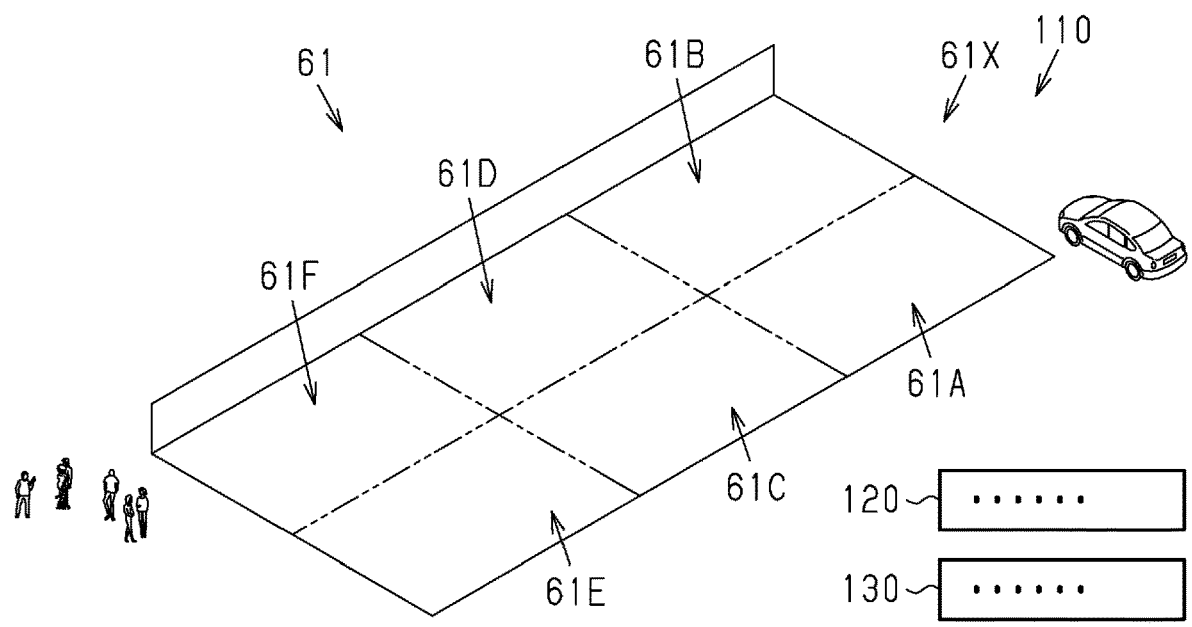
FIG. 13 is a perspective view of a building-related image shown on a displayed portion by a display device when the portable units are not placed in the layout portion.

The display device 100 projects a building-related image to the region 61X of the displayed portion 61 so that the building-related image is shown in the region 61X. The display device 100 is, for example, a projector. The display device 100 is arranged at a position that allows the display device 100 to project a building-related image corresponding to the detection result of the detector PA onto the displayed portion 61. There are one or more display devices 100. When a portable unit 10 is not placed in the layout portion 62, in other words, when no identification section 50 is present in the region 61X, the display device 100 shows a premise 110, a first information display section 120, and a second information display section 130 in the displayed portion 61 as shown in FIG. 13. The first information display section 120 displays the model cost information. The second information display section 130 displays the model environment load information. When only the premise 110 is shown on the displayed portion 61, the first information display section 120 and the second information display section 130 display, for example, information related to the premise 110 and information related to the periphery of the premise 110.

One example of how to use the simulation system 1 will now be described with reference to FIGS. 14 to 17.

Figure 14:
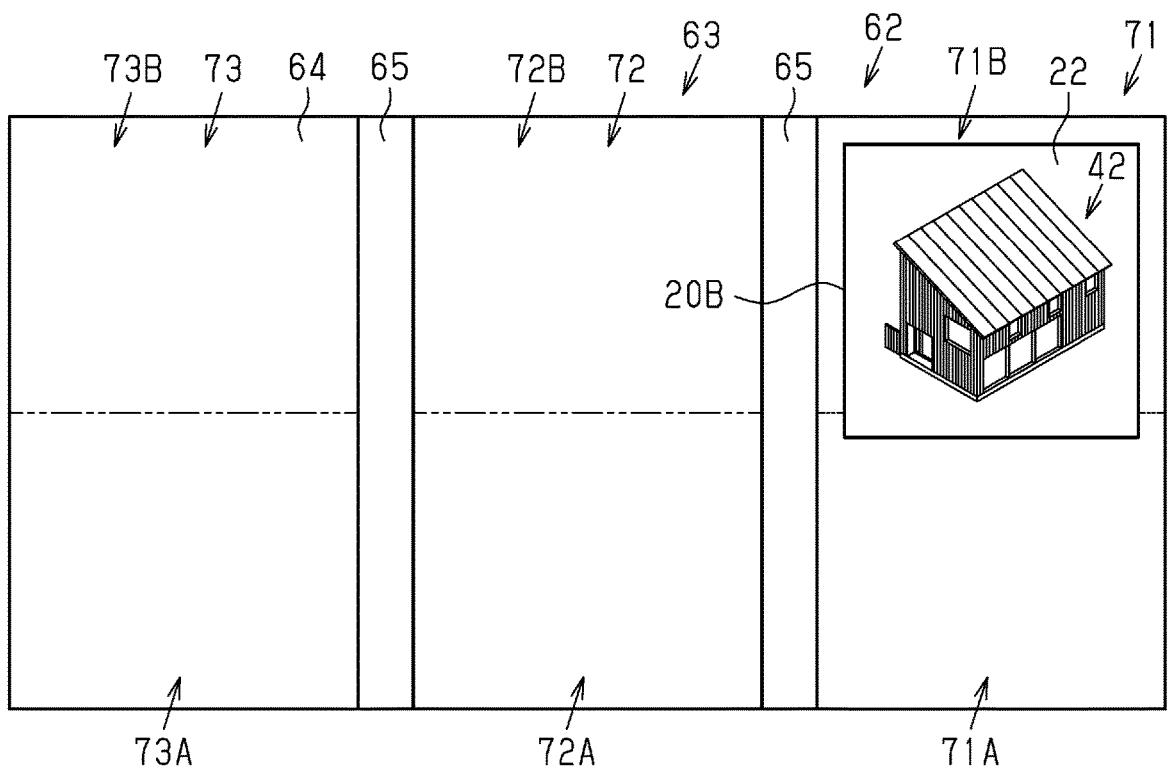
FIG. 14 is a plan view of the layout portion when the first type portable unit is placed in a rear area of a first region of the layout portion.
Figure 15:
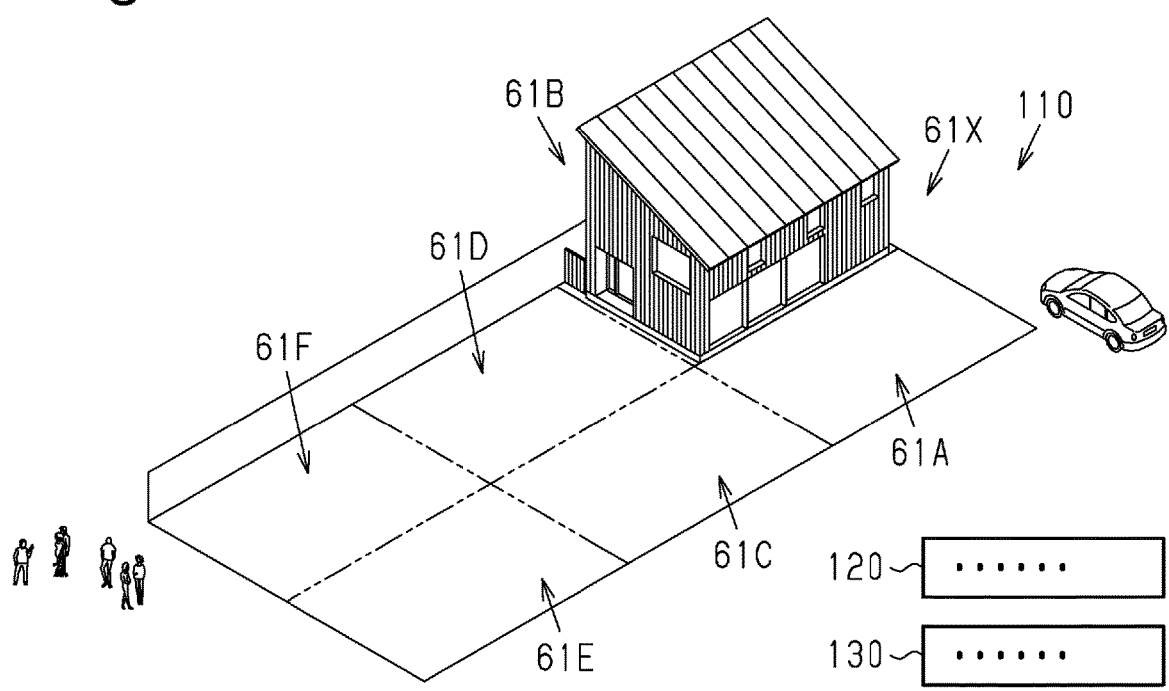
FIG. 15 is a perspective view of a building-related image shown on the displayed portion by the display device in case of FIG. 14.

As shown in FIG. 14, for example, the first type portable unit 20B is placed in the rear area 71B of the first region 71 with the second image display section 42 facing upward. In this case, the detector PA detects the second identification section 52 placed in the rear area 71B based on the layout portion information transmitted from the camera 80. The calculator PB refers to the detection result of the detector PA to calculate the model cost information and the model environment load information related to the two-story residence with a pent roof. As shown in FIG. 15, the controller PC controls the display device 100 to show the building-related image of the two-story residence with a pent roof in the second region 61B. The controller PC controls the display device 100 to show the model cost information related to the two-story residence with a pent roof on the first information display section 120. The controller PC controls the display device 100 to show the model environment load information related to the two-story residence with a pent roof on the second information display section 130.

Figure 16:
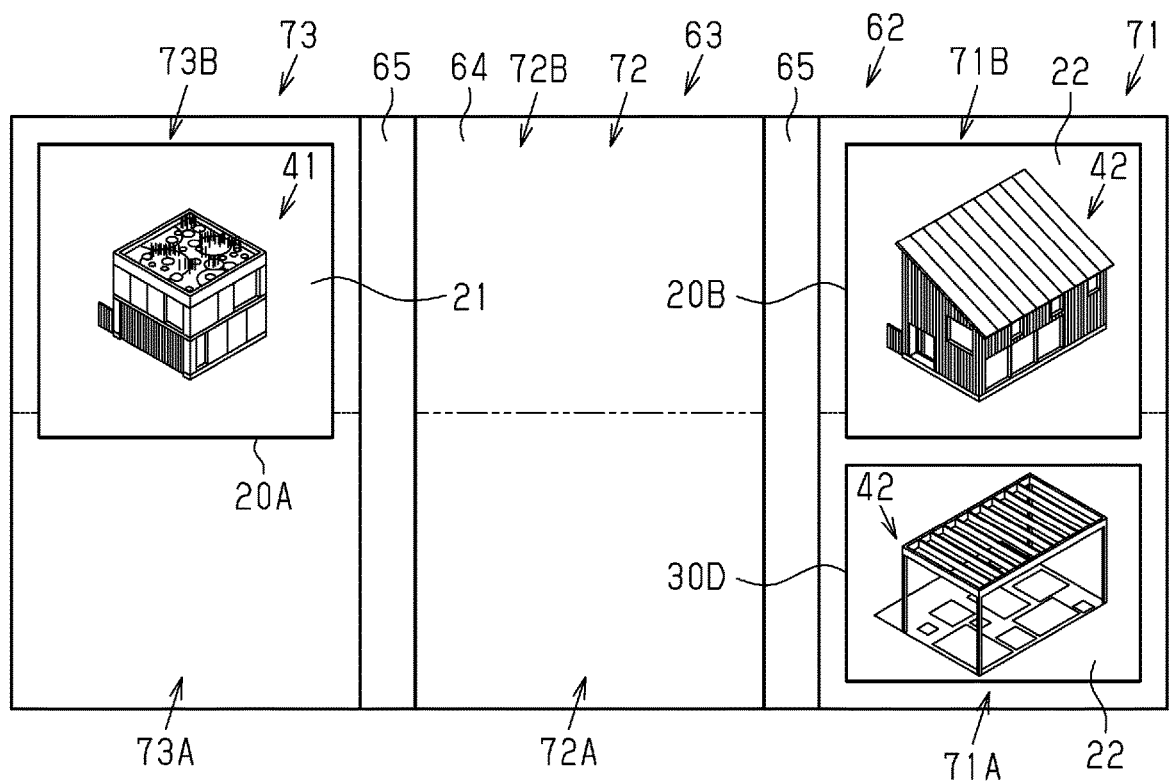
FIG. 16 is a plan view of the layout portion when the first type portable unit is placed in the rear area of the first region, the second type portable unit is placed in a front area of the first region, and the first type portable unit is placed in a rear area of a third region.

As shown in FIG. 16, for example, in the state shown in FIG. 14, the second type portable unit 30D is placed in the front area 71A of the first region 71 with the second image display section 42 facing upward, and the first type portable unit 20A is placed in the rear area 73B of the third region 73 with the first image display section 41 facing upward. In this case, the detector PA detects the second identification section 52 placed in the front area 71A and the first identification section 51 placed in the rear area 73B based on the layout portion information transmitted from the camera 80. The calculator PB refers to the detection result of the detector PA to calculate the total cost for the model cost information related to the two-story residence with a pent roof, the pergola, and the two-story residence with a flat roof. The calculator PB refers to the detection result of the detector PA to calculate the total value for the model environment load information related to the two-story residence with a pent roof, the pergola, and the two-story residence with a flat roof.

Figure 17:
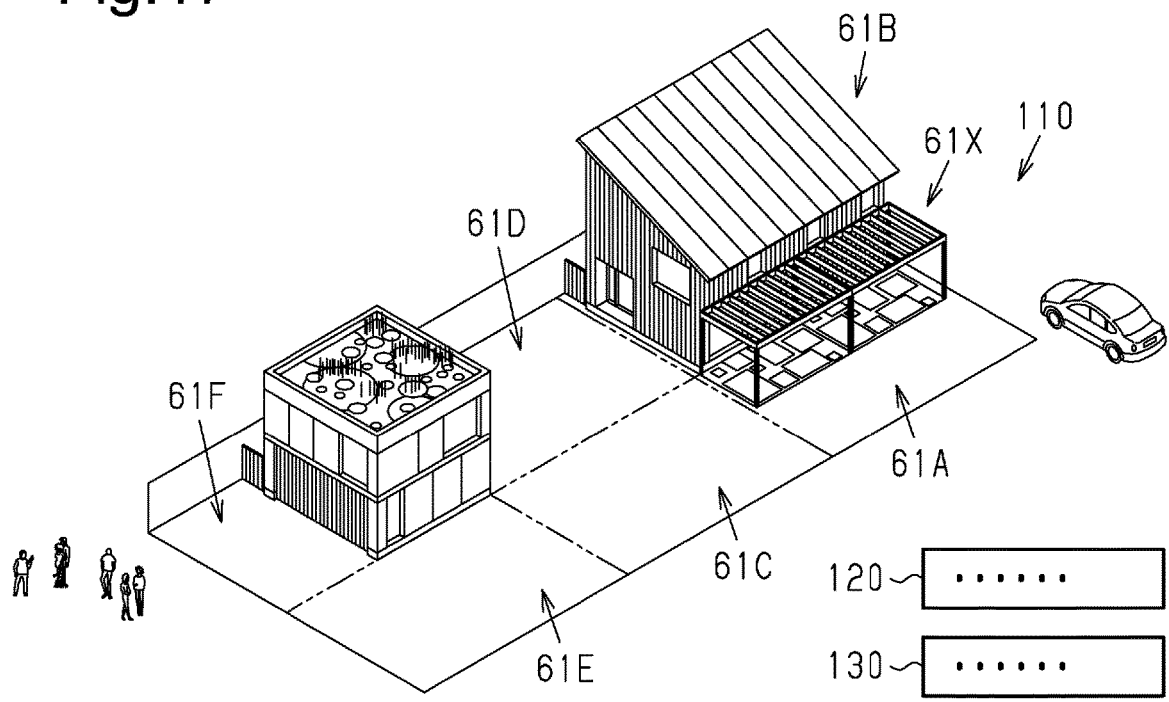
FIG. 17 is a perspective view of a building-related image shown on the displayed portion by the display device in case of FIG. 16.

As shown in FIG. 17, the controller PC controls the display device 100 to show the building-related image of the pergola in the first region 61A. The controller PC controls the display device 100 to show the building-related image of the two-story residence with a flat roof in the sixth region 61F. The controller PC controls the display device 100 to show the total cost of the model cost information related to the two-story residence with a pent roof, the pergola, and the two-story residence with a flat roof on the first information display section 120. The controller PC controls the display device 100 to show the total value of the model environment load information related to the two-story residence with a pent roof, the pergola, and the two-story residence with a flat roof on the second information display section 130.

The operation and advantages of the simulation system 1 will now be described.

Since a building-related image is shown in accordance with a detection result of the detector PA that detects the portable unit 10, a simulation of a building is easily created.

Modified Examples

The above embodiment exemplifies, without any intention to limit, an applicable form of a simulation system related to the present invention. The simulation system related to the present invention can take a form differing from the form illustrated in the embodiment. In one example, some of the components of the embodiment may be replaced, changed, or omitted. Further, another component may be added to the embodiment. Examples of a modification to the embodiment will now be described.

The configuration of the display device 100 can be changed in any manner. In a modified example, the display device 100 of the simulation system 1 may serve as the displayed portion 61 on which a building-related image is shown. In this case, the display screen of the display device 100 is arranged on the table 60.

The display device 100 may project a building-related image onto any place. In a modified example, the display device 100 of the simulation system 1 projects a building-related image onto a wall serving as the displayed portion 61 so that the building-related image is shown on the wall.

The additional information calculated by the calculator PB may have any content. In a modified example, the calculator PB of the simulation system 1 calculates at least one of information related to a sunshine simulation, information related to a ventilation simulation, and information related to a regulation check, in addition to or instead of the model cost information and the model environment load information.

The controller PC may employ any method for showing a building-related image. In a modified example, the controller PC of the simulation system 1 changes the building-related image corresponding to a model image in accordance with the area in which the portable unit 10 is placed. In a modified example, when one portable unit 10 is placed in the front areas 71A, 72A, or 73A with the image display section 40 displaying the image model related to a two-story garage, a two-story residence, or a two-story annex model of a residence facing upward, the controller PC of the simulation system 1 changes the building-related images shown in the corresponding region 61X to the building-related image of a one-story garage, a one-story residence, or a one-story annex model of a residence, respectively. In this modified example, for example, when the first type portable unit 20B is placed in the front area 71A with the second image display section 42 facing upward, the controller PC controls the display device 100 to show a building-related image of a one-story residence with a pent roof in the first region 61A.

The processor 92 does not have to include a central processing unit and a memory to execute the above-described various types of processes with software. For example, the processor 92 may include dedicated hardware (an application specific integrated circuit: ASIC) to execute at least some of the processes. That is, the processor 92 may be circuitry that includes 1) one or more exclusive hardware circuits such as ASIC, 2) one or more processors (microcomputers) running on a computer program (software), or 3) a combination of the above.

The invention claimed is:

1. A simulation system, comprising:
   a portable unit configured to create simulation of a building;
   a detector configured to detect the portable unit;
   a display device configured to show an image; and
   a controller that refers to a detection result of the detector, and controls the display device to show an image related to the building, wherein the portable unit comprises an image display section that displays an image related to an element of the building, and an identification section that indicates identification information corresponding to the image.

2. The simulation system according to claim 1, wherein the controller controls the display device to show at least one of the image of the building or an image of an outdoor facility.

3. The simulation system according to claim 1, the controller further controls the display device to show additional information associated with the building in addition to the image related to the building.

4. The simulation system according to claim 1, further comprising a displayed portion in which the image is shown.

5. The simulation system according to claim 4, further comprising:
   a layout portion configured to hold the portable unit; and
   a table,
   wherein the displayed portion and the layout portion are arranged on the table.

6. The simulation system according to claim 1, further comprising a layout portion configured to hold the portable unit.

7. The simulation system according to claim 1 wherein
   the portable unit is a polyhedron, and
   the image display section and the identification section are arranged on different surfaces of the polyhedron.

* * * * *